(12) United States Patent
Jin et al.

(10) Patent No.: US 11,895,429 B2
(45) Date of Patent: Feb. 6, 2024

(54) INFRARED DETECTOR AND INFRARED IMAGER BASED ON CARBON NANOTUBE

(71) Applicants: Tsinghua University, Beijing (CN); HON HAI PRECISION INDUSTRY CO., LTD., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 906 days.

(21) Appl. No.: 16/901,218

(22) Filed: Jun. 15, 2020

(65) Prior Publication Data
US 2021/0203862 A1    Jul. 1, 2021

(30) Foreign Application Priority Data
Dec. 25, 2019   (CN) .......................... 201911357818.8

(51) Int. Cl.
| | |
|---|---|
| *H04N 5/33* | (2023.01) |
| *C01B 32/168* | (2017.01) |
| *G01J 5/12* | (2006.01) |
| *G01J 5/00* | (2022.01) |
| *G03F 7/038* | (2006.01) |
| *G03F 7/039* | (2006.01) |

(52) U.S. Cl.
CPC ............. *H04N 5/33* (2013.01); *C01B 32/168* (2017.08); *G01J 5/12* (2013.01); *C01P 2002/82* (2013.01); *C01P 2002/84* (2013.01); *C01P 2004/03* (2013.01); *G01J 2005/0077* (2013.01); *G03F 7/038* (2013.01); *G03F 7/039* (2013.01)

(58) Field of Classification Search
CPC ............ H04N 5/33; C01B 32/168; G01J 5/12
See application file for complete search history.

(56) References Cited

U.S. PATENT DOCUMENTS

| 8,269,169 B1 | 9/2012 | Sinton et al. | |
|---|---|---|---|
| 2008/0170982 A1* | 7/2008 | Zhang ...................... | D02G 3/44 |
| | | | 423/447.3 |

(Continued)

FOREIGN PATENT DOCUMENTS

CN          103344328          10/2013

*Primary Examiner* — Hugh Maupin
(74) *Attorney, Agent, or Firm* — ScienBiziP, P.C.

(57) ABSTRACT

An infrared detector includes a thermoelectric element, an infrared light absorber located on the thermoelectric element, and an electrical signal detecting element. The infrared light absorber includes a first drawn carbon nanotube film, a second drawn carbon nanotube film, and a third drawn carbon nanotube film stacked on each other. The first drawn carbon nanotube film includes a plurality of first carbon nanotubes substantially extending along a first direction. The second drawn carbon nanotube film includes a plurality of second carbon nanotubes substantially extending along a second direction. The third drawn carbon nanotube film includes a plurality of third carbon nanotubes substantially extending along a third direction. The first direction and the second direction form an angle of about 42 degrees to about 48 degrees, and the first direction and the third direction form an angle of about 84 degrees to about 96 degrees.

20 Claims, 14 Drawing Sheets

(56) References Cited

U.S. PATENT DOCUMENTS

| | | | | |
|---|---|---|---|---|
| 2011/0036828 | A1* | 2/2011 | Feng | H05B 3/342 |
| | | | | 219/545 |
| 2011/0315882 | A1* | 12/2011 | Hu | H10K 30/88 |
| | | | | 250/353 |
| 2013/0137324 | A1* | 5/2013 | Tang | D06M 23/08 |
| | | | | 428/221 |
| 2014/0332673 | A1* | 11/2014 | Lehman | G01J 5/20 |
| | | | | 977/954 |
| 2015/0060769 | A1* | 3/2015 | Hu | H10K 30/81 |
| | | | | 257/29 |
| 2021/0190593 | A1* | 6/2021 | Yao | G02B 5/3058 |
| 2022/0223747 | A1* | 7/2022 | Shimatani | H01L 31/11 |

* cited by examiner

10

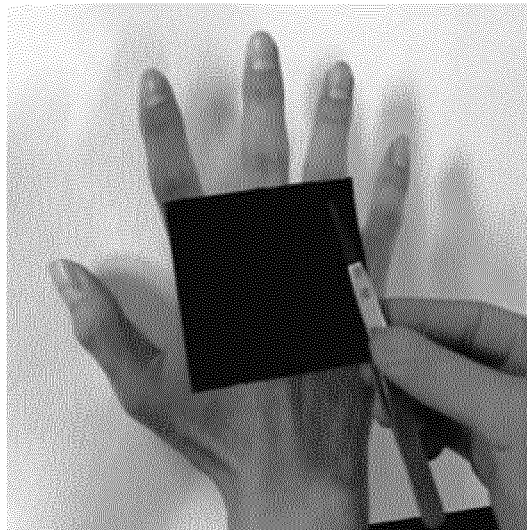
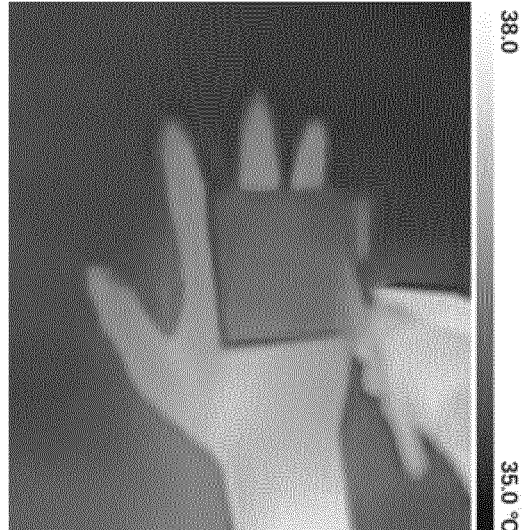
FIG. 26  FIG. 27
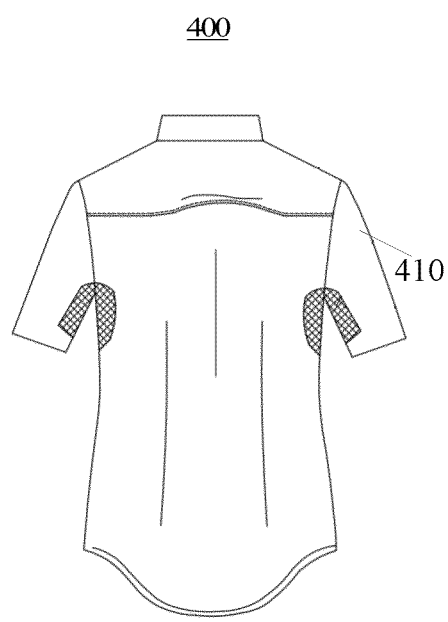
FIG. 28

US 11,895,429 B2

INFRARED DETECTOR AND INFRARED IMAGER BASED ON CARBON NANOTUBE

CROSS-REFERENCE TO RELATED APPLICATIONS

This application is related to commonly-assigned application entitled, "INFRARED STEALTH CLOTH AND INFRARED STEALTH CLOTHES BASED ON CARBON NANOTUBE", concurrently filed Ser. No. 16/901,225. The entire contents of which are incorporated herein by reference.

FIELD

The present application relates to an infrared detector and an infrared imager based on carbon nanotube.

BACKGROUND

Infrared radiation is an electromagnetic wave with a wavelength between visible light and microwaves. The infrared radiation is imperceptible to human eyes. To detect the infrared radiation and measure its strength, the infrared radiation must be transformed into other physical quantities that can be detected and measured. An infrared detector can convert infrared signals into electrical signals, so that the infrared detector can be used to detect infrared rays or infrared energy. The infrared detector is widely used in medical, prospecting, military, and life fields.

Infrared detectors include active infrared detectors and passive infrared detectors. An active infrared detector comprises an infrared transmitter, an infrared receiver, and an alarm system. When someone or an object contacts infrared rays emitted by the infrared transmitter, the infrared receiver generates a signal change, and the signal change causes the alarm system to alarm. A passive infrared detector itself does not comprise an infrared emission source. When an external infrared signal is received by the passive infrared detector, a certain signal is generated, thereby detecting the existence and energy level of infrared rays. Thus, an infrared detector, whether an active infrared detector or a passive infrared detector, should include at least one infrared detect element or an infrared absorber. However, the absorption rate of the existing infrared absorber is low.

Therefore, there is room for improvement in the art.

BRIEF DESCRIPTION OF THE DRAWINGS

Implementations of the present technology will now be described, by way of embodiments, with reference to the attached figures, wherein:

FIG. 26 shows an optical photo of a hand covered by the infrared stealth cloth of FIG. 25.

FIG. 27 shows a thermal photo of the hand covered by the infrared stealth cloth of FIG. 25.

FIG. 28 is a schematic view of a fifth embodiment of an infrared stealth clothes.

DETAILED DESCRIPTION

Figure 1:
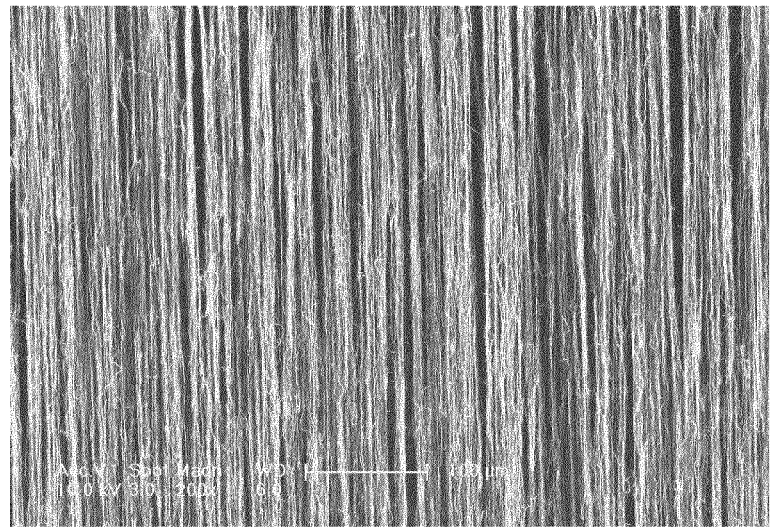
FIG. 1 shows a scanning electron microscope (SEM) image of a first embodiment of a drawn carbon nanotube film.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

An infrared absorber of a first embodiment is a carbon nanotube structure formed by stacking a plurality of drawn carbon nanotube films.

FIG. 1 shows a scanning electron microscope (SEM) image of a drawn carbon nanotube film. The drawn carbon nanotube film includes a plurality of successive and oriented carbon nanotubes joined end-to-end by van der Waals attractive force therebetween. The plurality of carbon nanotubes in the drawn carbon nanotube film substantially extends along the same direction. The plurality of carbon nanotubes is parallel to a surface of the drawn carbon nanotube film. The drawn carbon nanotube film is a free-standing film. The drawn carbon nanotube film can be bent to desired shapes without breaking. A film can be drawn from a carbon nanotube array to form the drawn carbon nanotube film. The drawn carbon nanotube film can be a substantially pure structure of the carbon nanotubes, with few impurities. The plurality of carbon nanotubes may be single-walled, double-walled, multi-walled carbon nanotubes, or their combinations. The carbon nanotubes which are single-walled have a diameter of about 0.5 nanometers (nm) to about 50 nm. The carbon nanotubes which are double-walled have a diameter of about 1.0 nm to about 50 nm. The carbon nanotubes which are multi-walled have a diameter of about 1.5 nm to about 50 nm.

It can be understood that "substantially extend along the same direction" means that most of the carbon nanotubes extend along the same direction. Of course, there are a few randomly arranged carbon nanotubes in the drawn carbon nanotube film, and these carbon nanotubes do not significantly affect an overall alignment of the most of the carbon nanotubes in the drawn carbon nanotube film. Thus, "substantially extend along the same direction" can more accurately describe an internal structure of the drawn carbon nanotube film.

When at least two drawn carbon nanotube films are stacked on each other, adjacent drawn carbon nanotube films can be combined by only the van der Waals attractive force therebetween. Additionally, when the plurality of carbon nanotubes in the drawn carbon nanotube film extends along the same direction, an angle can exist between orientations of carbon nanotubes in the adjacent drawn carbon nanotube films. The angle between aligned directions of carbon nanotubes in two adjacent drawn carbon nanotube films may be in a range from about 0 degree to about 90 degrees.

The term "free-standing" includes, but is not limited to, the drawn carbon nanotube film that does not have to be supported by a substrate. For example, a free-standing drawn carbon nanotube film can sustain the weight of itself when it is hoisted by a portion thereof without any significant damage to its structural integrity. So, if the free-standing drawn carbon nanotube film is placed between two separated supporters, a portion of the free-standing drawn carbon nanotube film, not in contact with the two supporters, would be suspended between the two supporters and yet maintain film structural integrity.

In order to study the absorption performance of the infrared absorber, the present application prepares four different samples for comparison, and the four samples are shown in FIGS. 2 to 9 respectively. In order to clearly show positions and arrangements of carbon nanotubes of the four samples, only one carbon nanotube is shown for each drawn carbon nanotube film (in fact, each drawn carbon nanotube film includes a plurality of substantially parallel carbon nanotubes), which cannot be seen as a limitation to the present application.

A First Sample 10

Figure 2:
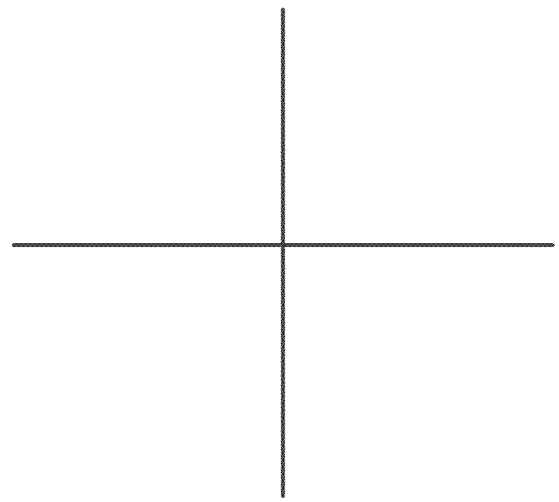
FIG. 2 shows a schematic view of the first embodiment of length extending directions of carbon nanotubes in two stacked drawn carbon nanotube films (a first sample).
Figure 3:
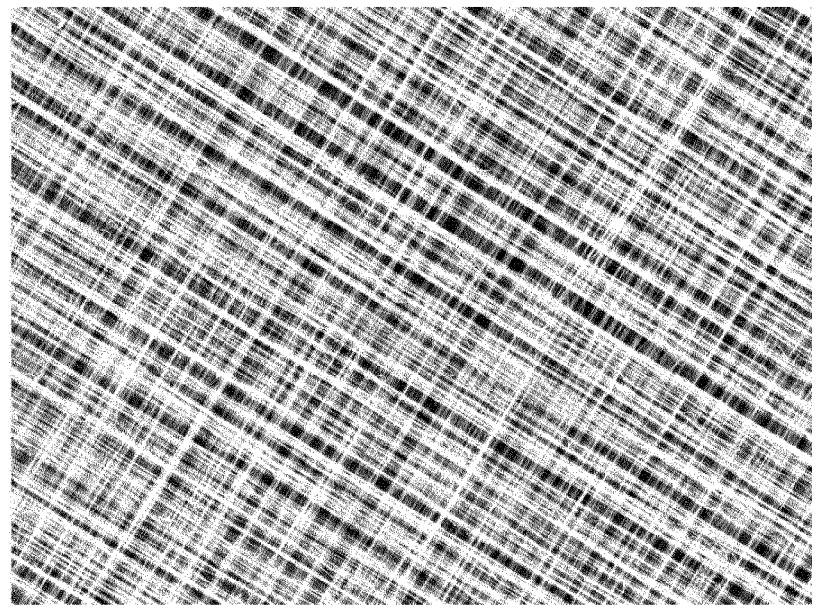
FIG. 3 shows an SEM image of the first sample.

The first sample 10 consists of two drawn carbon nanotube films stacked on each other, an angle between aligned directions of carbon nanotubes in the two drawn carbon nanotube films is about 90 degrees. In the first sample 10, the two stacked drawn carbon nanotube films form a cross "+" shape, as shown in FIGS. 2 and 3. In FIG. 2, in order to clearly show the positional relationship of the two drawn carbon nanotube films, each of the two drawn carbon nanotube films is presented by a single carbon nanotube.

A Second Sample 20

Figure 4:
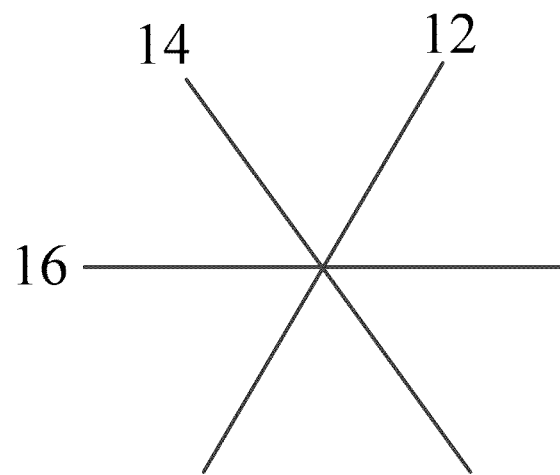
FIG. 4 shows a schematic view of the first embodiment of length extending directions of carbon nanotubes in three stacked drawn carbon nanotube films (a second sample).

The second sample 20 consists of three drawn carbon nanotube films stacked on each other, an angle between aligned directions of carbon nanotubes in two of the three drawn carbon nanotube films is about 60 degrees. As shown in FIG. 4, the second sample 20 consists of a first drawn carbon nanotube film 12, a second drawn carbon nanotube film 14, and a third drawn carbon nanotube film 16 stacked on each other. The second drawn carbon nanotube film 14 is between the first drawn carbon nanotube film 12 and the third drawn carbon nanotube film 16. A length extending direction of carbon nanotubes in the first drawn carbon nanotube film 12 and a length extending direction of carbon nanotubes in the second drawn carbon nanotube film 14 form an angle of about 60 degrees. The length extending direction of carbon nanotubes in the second drawn carbon nanotube film 14 and a length extending direction of carbon nanotubes in the third drawn carbon nanotube film 16 form an angle of about 60 degrees. In the second sample 20, the three stacked drawn carbon nanotube films form a "✳" shape. In FIG. 4, in order to clearly show the positional relationship of the first drawn carbon nanotube film 12, the second drawn carbon nanotube film 14, and the third drawn carbon nanotube film 16, each of the first drawn carbon nanotube film 12, the second drawn carbon nanotube film 14, and the third drawn carbon nanotube film 16 is presented by a single carbon nanotube.

A Third Sample 30

Figure 5:
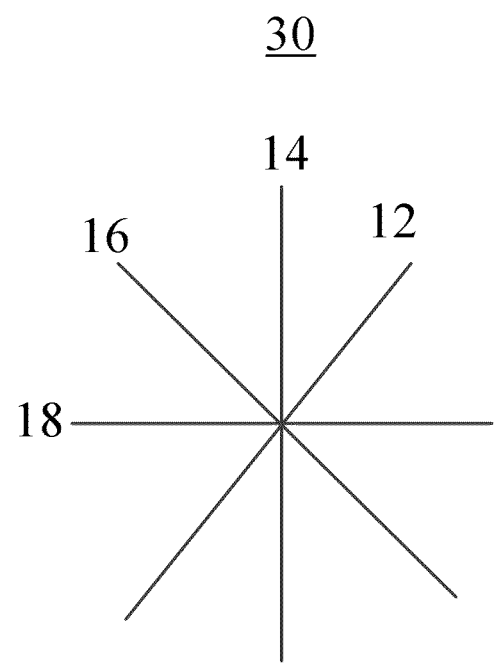
FIG. 5 shows a schematic view of the first embodiment of length extending directions of carbon nanotubes in four stacked drawn carbon nanotube films (a third sample).
Figure 6:
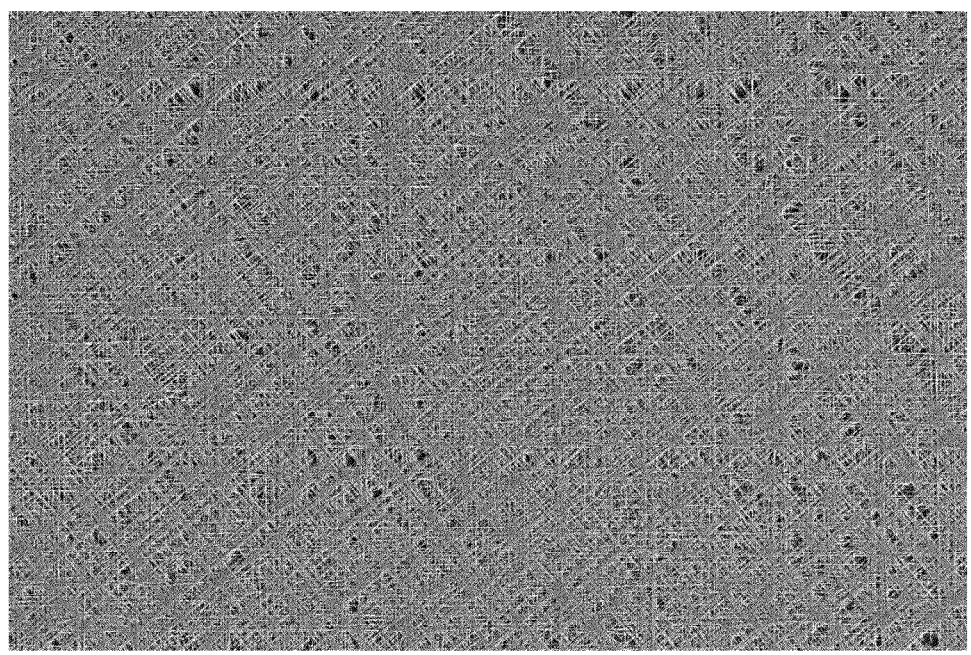
FIG. 6 shows an SEM image of the third sample.

The third sample 30 consists of four drawn carbon nanotube films stacked on each other. As shown in FIG. 5 and FIG. 6, the third sample 30 consists of a first drawn carbon nanotube film 12, a second drawn carbon nanotube film 14, a third drawn carbon nanotube film 16, and a fourth drawn carbon nanotube film 18. In FIG. 5, in order to clearly show the positional relationship of the first drawn carbon nanotube film 12, the second drawn carbon nanotube film 14, the third drawn carbon nanotube film 16, and the fourth drawn carbon nanotube film 18, each of the first drawn carbon nanotube film 12, the second drawn carbon nanotube film 14, the third drawn carbon nanotube film 16, and the fourth drawn carbon nanotube film 18 is presented by a single carbon nanotube. A length extending direction of carbon nanotube in the first drawn carbon nanotube film 12 and a length extending direction of carbon nanotube in the second drawn carbon nanotube film 14 form an angle of about 45 degrees. The length extending direction of carbon nanotube in the second drawn carbon nanotube film 14 and a length extending direction of carbon nanotube in the third drawn carbon nanotube film 16 form an angle of about 45 degrees. The length extending direction of carbon nanotube in the third drawn carbon nanotube film 16 and a length extending direction of carbon nanotube in the fourth drawn carbon nanotube film 18 form an angle of about 45 degrees. The length extending direction of carbon nanotube in the fourth drawn carbon nanotube film 18 and the length extending direction of carbon nanotube in the second drawn carbon nanotube film 14 form an angle of about 90 degrees. In the third sample 30, the four stacked drawn carbon nanotube films form a "✱" shape.

A Fourth Sample 40

Figure 7:
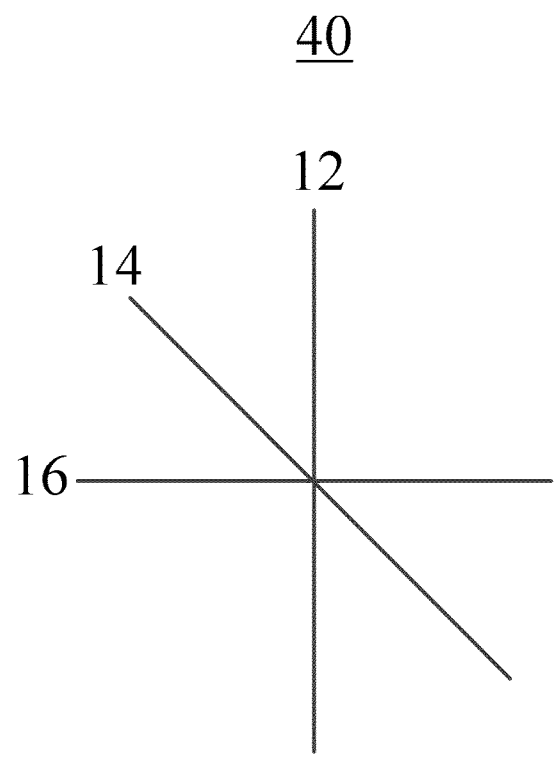
FIG. 7 shows a schematic view of the first embodiment of length extending directions of carbon nanotubes in another three stacked drawn carbon nanotube films (a fourth sample).
Figure 8:
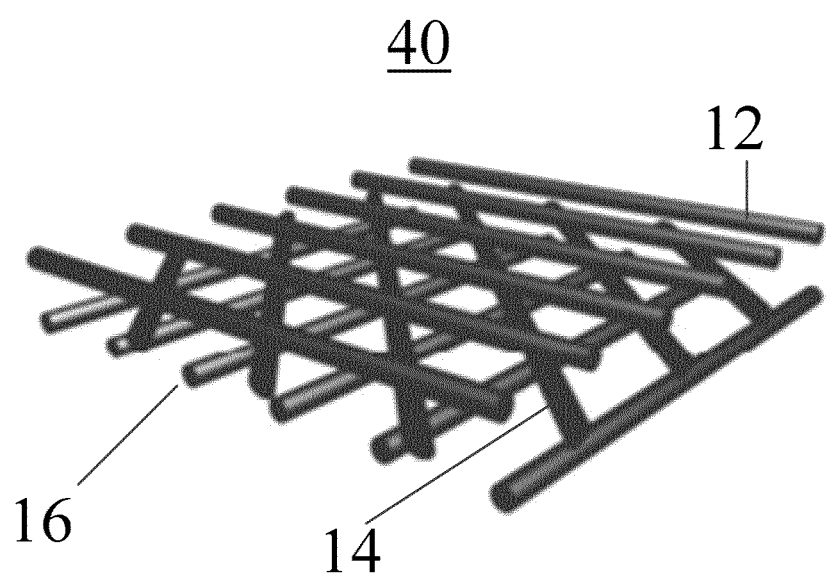
FIG. 8 shows a schematic view of the fourth sample.
Figure 9:
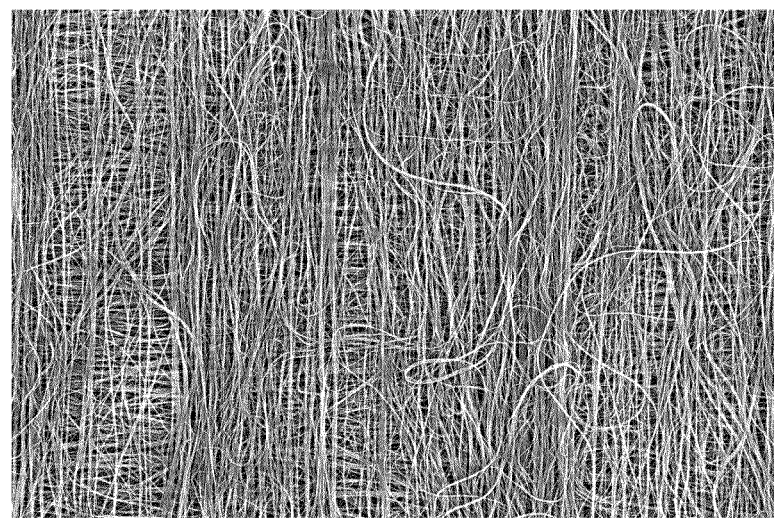
FIG. 9 shows an SEM image of the fourth sample.

The fourth sample 40 includes three drawn carbon nanotube films stacked on each other. In one embodiment, the fourth sample 40 consists of three drawn carbon nanotube films stacked on each other. As shown in FIGS. 7-9, the fourth sample 40 consists of a first drawn carbon nanotube film 12, a second drawn carbon nanotube film 14, and a third drawn carbon nanotube film 16 stacked on each other. The second drawn carbon nanotube film 14 is between the first drawn carbon nanotube film 12 and the third drawn carbon nanotube film 16. A length extending direction of carbon nanotube in the first drawn carbon nanotube film 12 and a length extending direction of carbon nanotube in the second drawn carbon nanotube film 14 form an angle of about 42 degrees to about 48 degrees. The length extending direction of carbon nanotube in the second drawn carbon nanotube film 14 and a length extending direction of carbon nanotube in the third drawn carbon nanotube film 16 form an angle of about 42 degrees to about 48 degrees. The length extending direction of carbon nanotube in the first drawn carbon nanotube film 12 and the length extending direction of carbon nanotube in the third drawn carbon nanotube film 16 form an angle of about 84 degrees to about 96 degrees. In one embodiment, the length extending direction of carbon nanotube in the first drawn carbon nanotube film 12 and the length extending direction of carbon nanotube in the second drawn carbon nanotube film 14 form the angle of about 45 degrees, the length extending direction of carbon nanotube in the second drawn carbon nanotube film 14 and the length extending direction of carbon nanotube in the third drawn carbon nanotube film 16 form the angle of about 45 degrees, and the length extending direction of carbon nanotube in the first drawn carbon nanotube film 12 and the length extending direction of carbon nanotube in the third drawn carbon nanotube film 16 form the angle of about 90 degrees. In FIG. 7, in order to clearly show the positional relationship of the first drawn carbon nanotube film 12, the second drawn carbon nanotube film 14, and the third drawn carbon nanotube film 16, each of the first drawn carbon nanotube film 12, the second drawn carbon nanotube film 14, and the third drawn carbon nanotube film 16 is presented by a single carbon nanotube.

Figure 10:
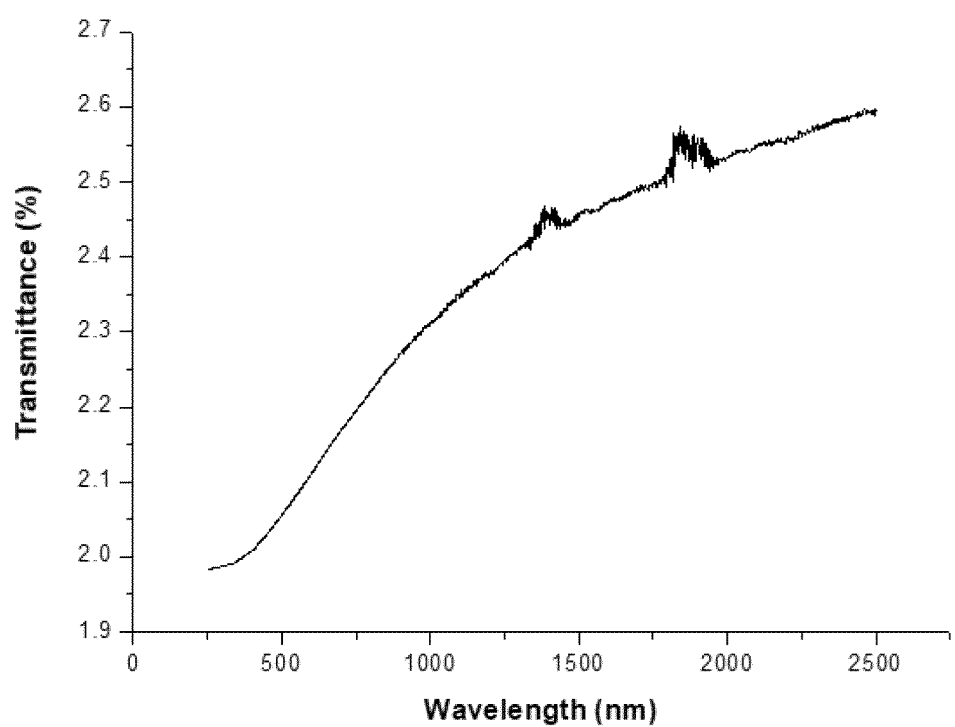
FIG. 10 is a transmission spectrum of the first sample in a range from ultraviolet (UV) wavelength to near-infrared (NIR) wavelength.

FIG. 10 shows a transmission spectrum of the first sample 10 in a range from ultraviolet (UV) wavelength to near-infrared (NIR) wavelength. Seen from FIG. 10, the transmissivity of the first sample 10 is very high, so the absorptivity of the first sample 10 is low. The structure of the first sample 10 is too sparse, the number and size of gaps in the first sample 10 are very large, and more light passes through the gaps of the first sample 10. Thus, the first sample 10 has a strong light transmissivity, as high as 2.6%, but the absorptivity of the first sample 10 is low.

Figure 11:
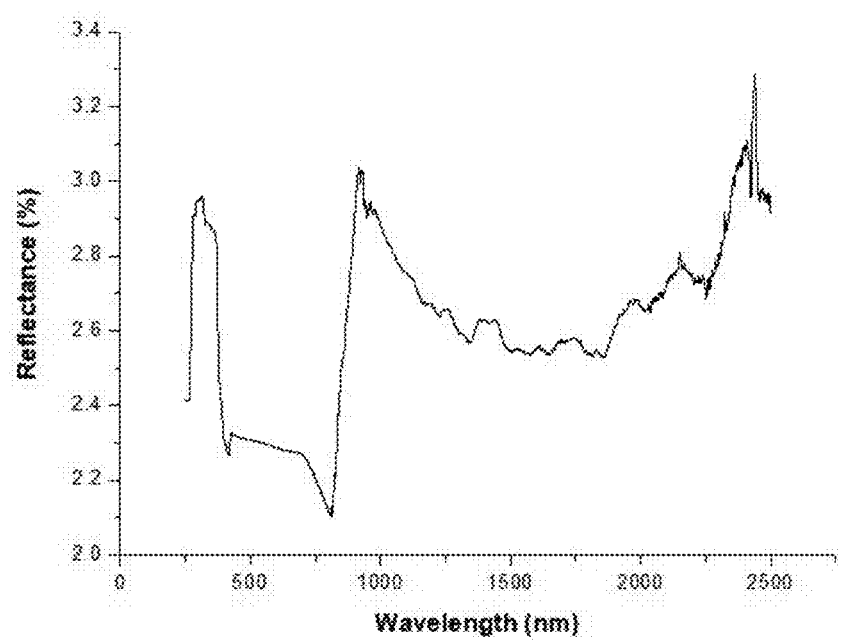
FIG. 11 is a reflection spectrum of the third sample in the range from UV wavelength to NIR wavelength.

FIG. 11 a reflection spectrum of the third sample 30 in the range from UV wavelength to NIR wavelength. Seen from FIG. 11, the reflectivity of the third sample 30 is as high as 3.3%, so the absorptivity of the third sample 30 is low. The structure of the third sample 30 is too compact and dense. When light irradiates the third sample 30, more light is reflected by the third sample 30. Thus, the third sample 30 has a high light reflectivity and a low light absorptivity. In addition, the absorptivity of the second sample 20 is also very low.

Figure 12:
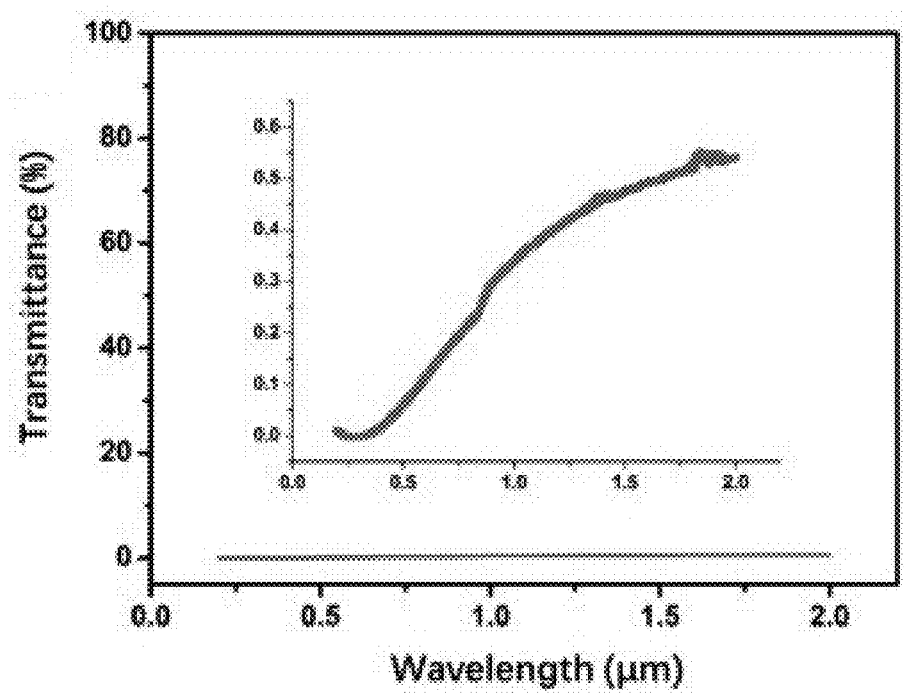
FIG. 12 is a transmission spectrum of the fourth sample in the range from UV wavelength to NIR wavelength.
Figure 13:
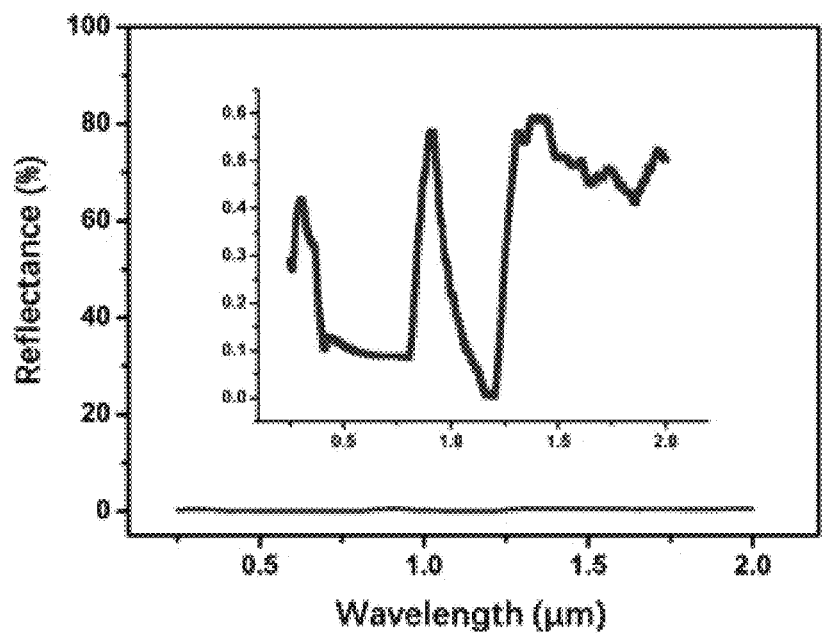
FIG. 13 is a reflection spectrum of the fourth sample in the range from UV wavelength to NIR wavelength.
Figure 14:
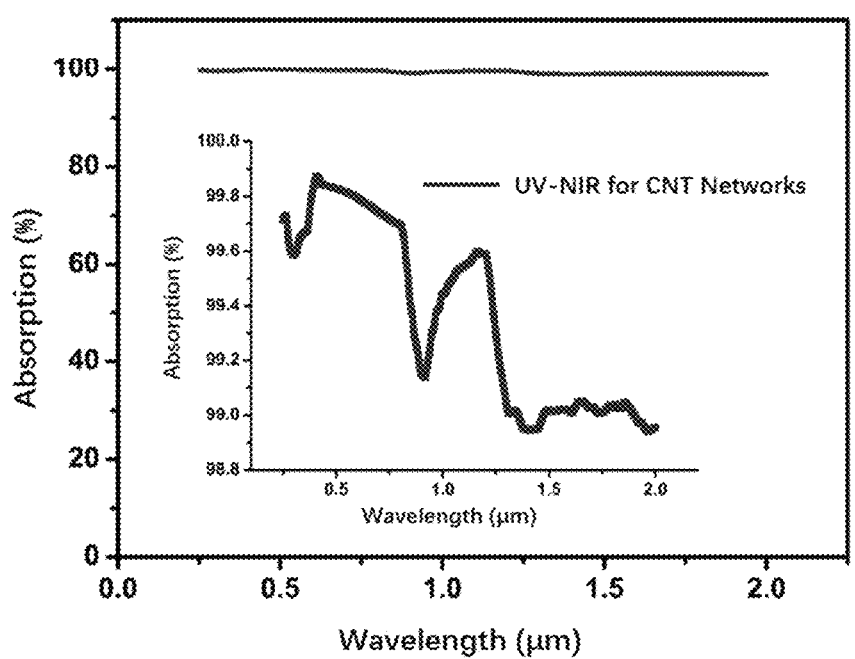
FIG. 14 is an absorption spectrum of the fourth sample in the range from UV wavelength to NIR wavelength.

Furthermore, the light transmissivity and reflectivity of the fourth sample 40 are measured by two independent optical measurement systems. FIG. 12 is a transmission spectrum of the fourth sample 40 in the range from UV wavelength to NIR wavelength. FIG. 13 is a reflection spectrum of the fourth sample 40 in the range from UV wavelength to NIR wavelength. The range from UV wavelength to NIR wavelength is a range from 250 nanometers (nm) to 2 micrometers ($\mu m$). FIG. 14 is an absorption spectrum of the fourth sample 40 measured by a spectrophotometer in the range from UV wavelength to NIR wavelength, and the illustration is an enlarged view of a high absorption region. Seen from FIGS. 12-14, the absorptivity of the fourth sample 40 in the range from UV wavelength to NIR wavelength (250 nm to 2 $\mu m$) is greater than or equal to 98.85%.

Figure 15:
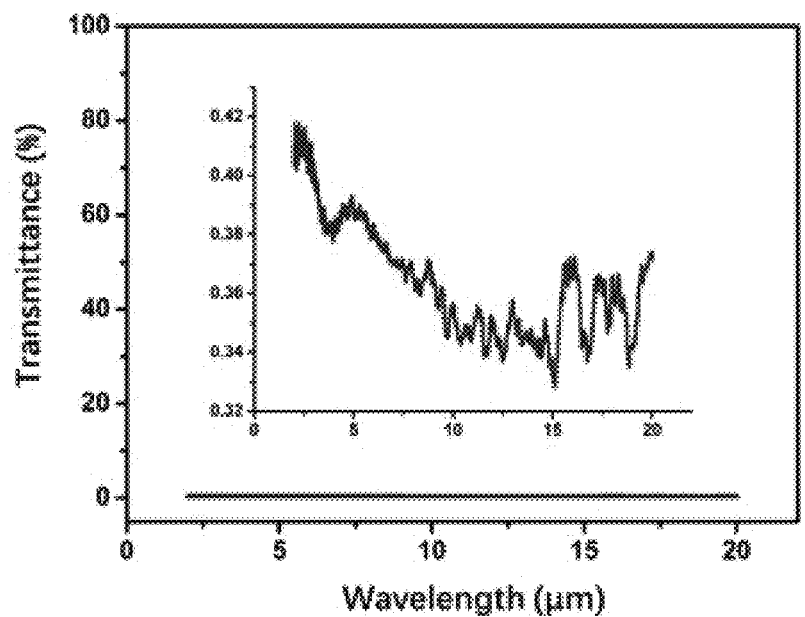
FIG. 15 is a transmission spectrum of the fourth sample in a mid-infrared (MIR) wavelength.
Figure 16:
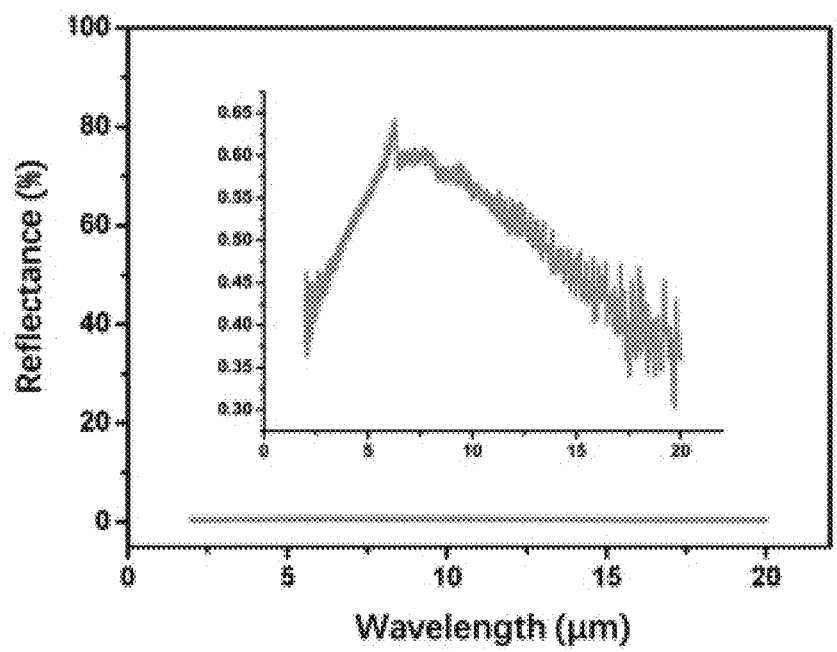
FIG. 16 is a reflection spectrum of the fourth sample in the MIR wavelength.
Figure 17:
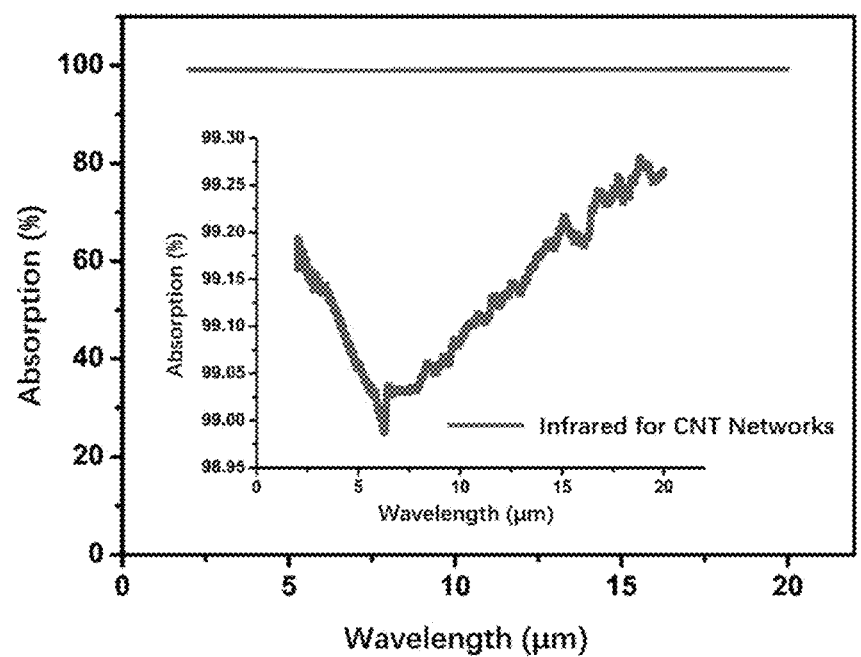
FIG. 17 is an absorption spectrum of the fourth sample in the MIR wavelength.

FIG. 15 is a transmission spectrum of the fourth sample 40 in a mid-infrared (MIR) wavelength. FIG. 16 is a reflection spectrum of the fourth sample 40 in the MIR wavelength. FIG. 17 is an absorption spectrum of the fourth sample 40 measured by a Fourier transform infrared (FTIR) spectrometer in the MIR wavelength, and the illustration is an enlarged view of a high absorption region. Seen from FIGS. 15-17, the absorptivity of the fourth sample 40 in the MIR wavelength (2 $\mu m$ to 20 $\mu m$) is greater than or equal to 98.975%.

Figure 18:
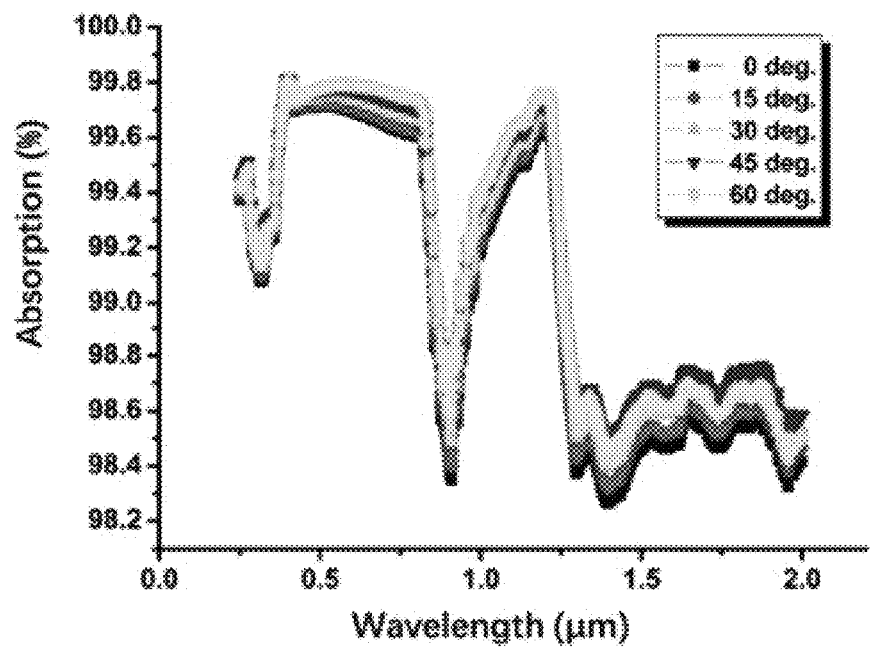
FIG. 18 is a spectrum of the fourth sample in a range from visible light wavelength to NIR wavelength at an incident angle of 0° to 60°.

FIG. 18 is a spectrum of the fourth sample 40 in a range from visible light wavelength to NIR wavelength at an incident angle of 0° to 60°. The incident angle refers to an angle between a light and a normal line, wherein the normal line is perpendicular to a surface of the fourth sample 40. In the fourth sample 40, the length extending directions of carbon nanotubes of the fourth sample 40 are parallel to the surface of the fourth sample 40, and the light irradiates the surface of the fourth sample 40. The angle between the light and the normal line is the incident angle. Seen from FIG. 18, in the wavelength range of about 250 nm to about 2 $\mu m$, the absorptivity of the fourth sample 40 remains constant, and is not affected by the different incident angles of light. The lowest absorptivity among all incident angles is greater than 98%. Thus, the fourth sample 40 can achieve omnidirectional absorption in the range from UV wavelength to NIR wavelength (250 nm to 2 $\mu m$). The "omnidirectional absorption" means that the fourth sample 40 has a high absorptivity at each incident angle.

Figure 19:
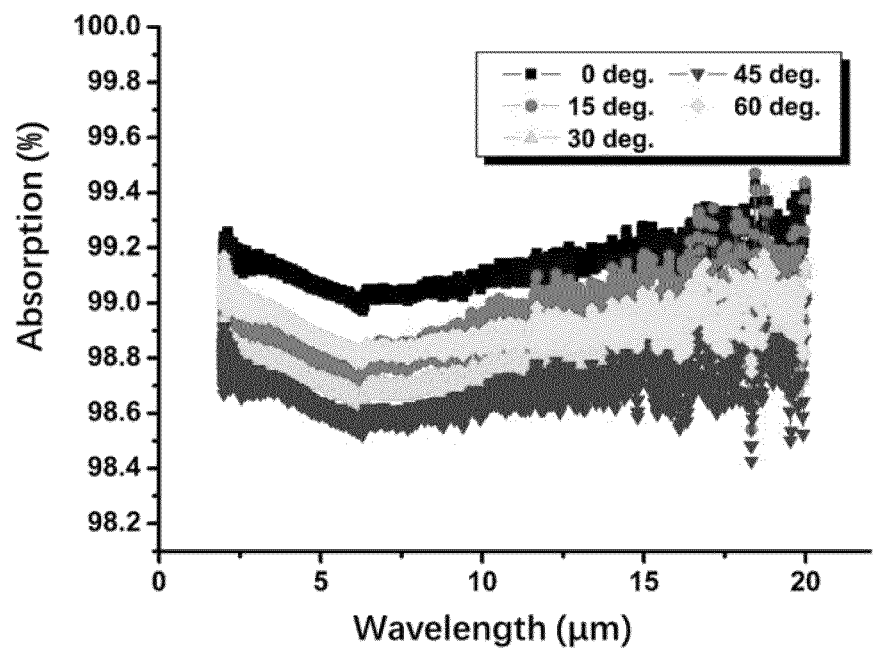
FIG. 19 is a spectrum the fourth sample in a MIR wavelength at an incident angle of 0° to 60°.

FIG. 19 is a spectrum of the fourth sample 40 in a MIR wavelength at an incident angle of 0° to 60°. Seen from FIG. 19, in the wavelength range of about 2 $\mu m$ to about 20 $\mu m$, the absorptivity of the fourth sample 40 remains constant, and is not affected by the different incident angles of light. The lowest absorptivity among all incident angles is greater than 98.5%. Thus, the fourth sample 40 can achieve omnidirectional absorption in the MIR wavelength (2 μm to 20 μm).

Figure 20:
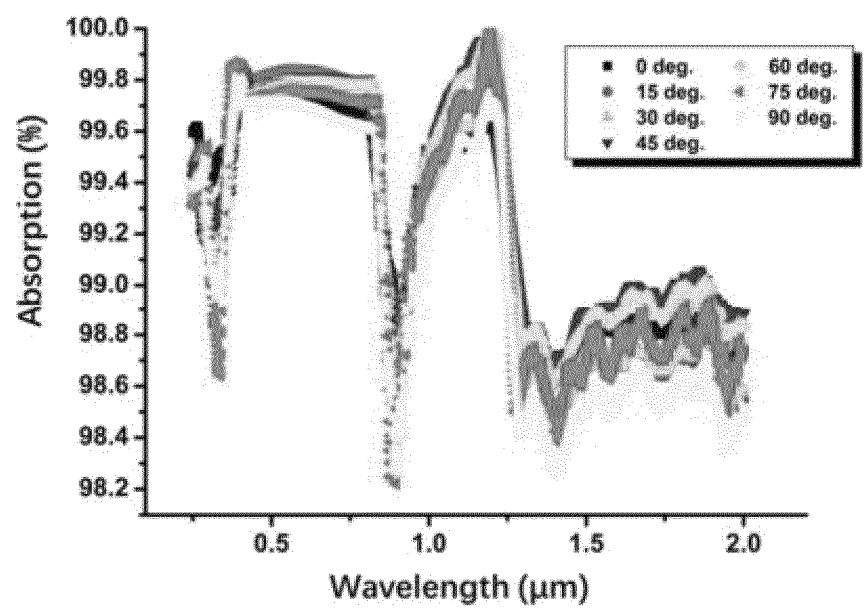
FIG. 20 is a spectrum of the fourth sample in a range from visible light wavelength to infrared wavelength at an incident polarization of 0° to 90°.

FIG. 20 is a spectrum of the fourth sample 40 in a range from visible light wavelength to infrared wavelength at an incident polarization of 0° to 90°. Seen from FIG. 20, each absorption spectrum is almost the same and not related to the polarization of the incident light. Thus, the absorption of the fourth sample 40 in the range from UV wavelength to NIR wavelength (250 nm to 2 μm) is not affected by the polarization of light.

Figure 21:
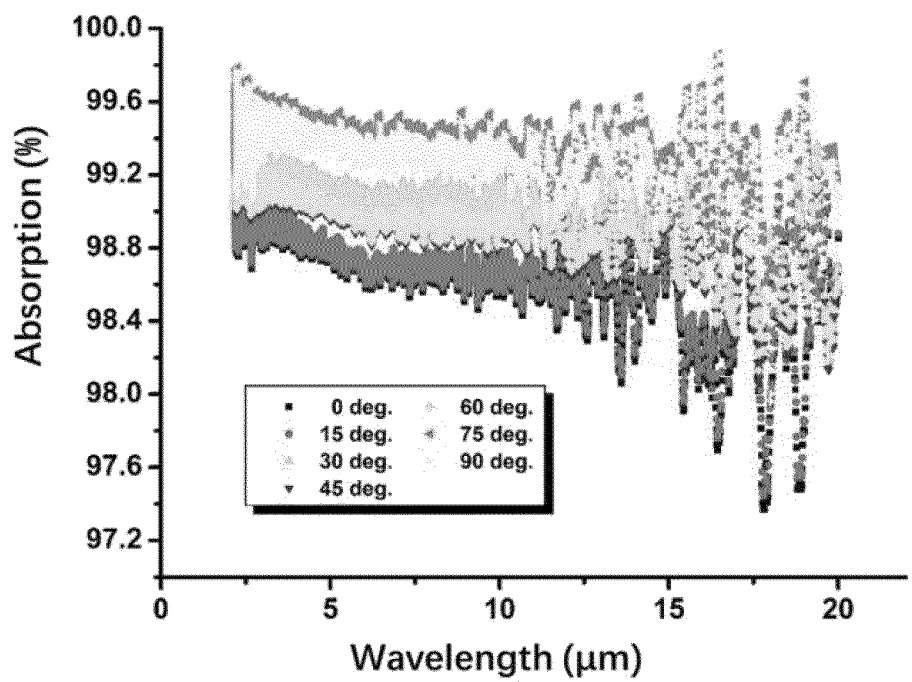
FIG. 21 is a spectrum of the fourth sample in a MIR wavelength at an incident polarization of 0° to 90°.

FIG. 21 is a spectrum of the fourth sample 40 in a MIR wavelength at an incident polarization of 0° to 90°. Seen from FIG. 21, each absorption spectrum is almost the same and not related to of the polarization of the incident light. Thus, the absorption of the fourth sample 40 in the MIR wavelength (2 μm to 20 μm) is not affected by the polarization of light.

Seen from FIG. 12 to FIG. 21, the absorption of the fourth sample 40 in the range from UV wavelength to MIR wavelength (250 nm to 20 μm) is not affected by the incident angles and the polarization of light. Thus, for the absorption of light in the range from UV wavelength to MIR wavelength (250 nm to 20 μm), the fourth sample 40 has an omnidirectional performance, and is not affected by the polarization of light.

In addition, in the fourth sample 40, the positions of the first drawn carbon nanotube film 12, the second drawn carbon nanotube film 14, and the third drawn carbon nanotube film 16 do not affect the absorption performance of the fourth sample 40. In the fourth sample 40, the second drawn carbon nanotube film 14, the first drawn carbon nanotube film 12, and the third drawn carbon nanotube film 16 are stacked on each other in that order. The first drawn carbon nanotube film 12 is between the second drawn carbon nanotube film 14 and the third drawn carbon nanotube film 16. The length extending direction of carbon nanotubes in the first drawn carbon nanotube film 12 and the length extending direction of carbon nanotubes in the second drawn carbon nanotube film 14 form the angle of about 42 degrees to about 48 degrees. The length extending direction of carbon nanotubes in the second drawn carbon nanotube film 14 and the length extending direction of carbon nanotubes in the third drawn carbon nanotube film 16 form the angle of about 42 degrees to about 48 degrees. The length extending direction of carbon nanotubes in the first drawn carbon nanotube film 12 and the length extending direction of carbon nanotubes in the third drawn carbon nanotube film 16 form the angle of about 84 degrees to about 96 degrees. In one embodiment, in the fourth sample 40, the first drawn carbon nanotube film 12 is between the second drawn carbon nanotube film 14 and the third drawn carbon nanotube film 16, the length extending direction of carbon nanotubes in the first drawn carbon nanotube film 12 and the length extending direction of carbon nanotubes in the second drawn carbon nanotube film 14 form the angle of about 45 degrees, the length extending direction of carbon nanotubes in the second drawn carbon nanotube film 14 and the length extending direction of carbon nanotubes in the third drawn carbon nanotube film 16 form the angle of about 45 degrees, and the length extending direction of carbon nanotubes in the first drawn carbon nanotube film 12 and the length extending direction of carbon nanotubes in the third drawn carbon nanotube film 16 form the angle of about 90 degrees.

In the first sample 10, the two drawn carbon nanotube films are arranged in a cross-stacked manner, and the carbon nanotubes of the first sample 10 are sparse so that there is a plurality of the gaps in the first sample 10. Most of the light passes through the gaps, thus the first sample 10 has a high transmissivity and a low absorptivity.

In the third sample 30, the four drawn carbon nanotube films are arranged in the "✳" shape. As the number of the drawn carbon nanotube films increases, the size of each gap between the carbon nanotubes gradually decreases, and the light transmissivity would decrease. However, because the carbon nanotubes are denser, more reflection occurs at an interface between air and the carbon nanotubes, so that most of the light is reflected. Thus, the third sample 30 has a higher reflectivity and a lower absorptivity.

Thus, compared with the first sample 10 and the third sample 30, the fourth sample 40 has a higher absorptivity, almost as high as 99%, and an omnidirectional absorption performance. That is, the absorptivity is not affected by the polarization of infrared light. However, the second sample 20 has no such effect.

Figure 22:
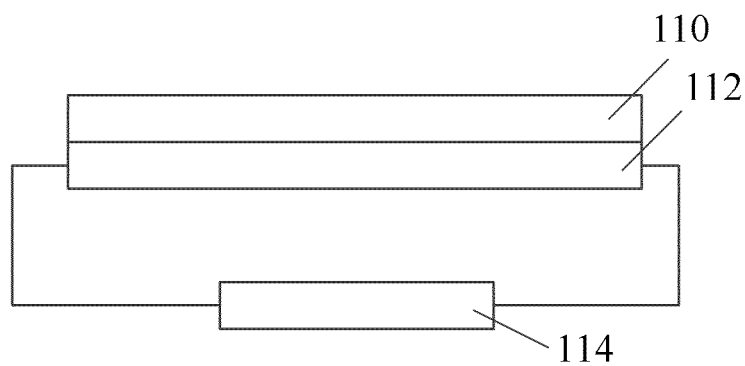
FIG. 22 shows a schematic view of a second embodiment of an infrared detector.

FIG. 22 shows an infrared detector 100 of a second embodiment. The infrared detector 100 includes an infrared light absorber 110, a thermoelectric element 112, and an electrical signal detecting element 114. The infrared light absorber 110 is located on and in direct contact with the thermoelectric element 112. The infrared light absorber 110 includes a plurality of carbon nanotubes, and length extending directions of the carbon nanotubes are parallel to the contact surface between the thermoelectric element 112 and the infrared light absorber 110. The electrical signal detecting element 114 is electrically connected to the thermoelectric element 112 by conductive wires. The electrical signal detecting element 114 and the thermoelectric element 112 are connected in series to form a loop for detecting a change of an electrical signal of the thermoelectric element 112.

The infrared light absorber 110 and the fourth sample 40 have the same structure. Thus, the infrared light absorber 110 includes a first drawn carbon nanotube film 12, a second drawn carbon nanotube film 14, and a third drawn carbon nanotube film 16 are stacked on each other. Each of the first drawn carbon nanotube film 12, the second drawn carbon nanotube film 14, and the third drawn carbon nanotube film 16 includes a plurality of carbon nanotubes joined end-to-end by van der Waals attractive force therebetween along length extending directions of the plurality of carbon nanotubes. The plurality of carbon nanotubes extends along the same direction. The second drawn carbon nanotube film 14 is between the first drawn carbon nanotube film 12 and the third drawn carbon nanotube film 16. A length extending direction of carbon nanotube in the first drawn carbon nanotube film 12 and a length extending direction of carbon nanotube in the second drawn carbon nanotube film 14 form an angle of about 42 degrees to about 48 degrees. The length extending direction of carbon nanotube in the second drawn carbon nanotube film 14 and a length extending direction of carbon nanotube in the third drawn carbon nanotube film 16 form an angle of about 42 degrees to about 48 degrees. The length extending direction of carbon nanotube in the first drawn carbon nanotube film 12 and the length extending direction of carbon nanotube in the third drawn carbon nanotube film 16 form an angle of about 84 degrees to about 96 degrees. In one embodiment, the length extending direction of carbon nanotube in the first drawn carbon nanotube film 12 and the length extending direction of carbon nanotube in the second drawn carbon nanotube film 14 form the angle of about 45 degrees, the length extending direction of carbon nanotube in the second drawn carbon nanotube film 14 and the length extending direction of carbon nanotube in the third drawn carbon nanotube film 16 form the angle of about 45 degrees, and the length extending direction of carbon nanotube in the first drawn carbon nanotube film 12 and the length extending direction of carbon nanotube in the third drawn carbon nanotube film 16 form the angle of about 90 degrees. Each of the first drawn carbon nanotube film 12, the second drawn carbon nanotube film 14, and the third drawn carbon nanotube film 16 is a free-standing film, thus the infrared light absorber 110 is also a free-standing structure.

The infrared light absorber 110 is configured to absorb infrared light and convert the infrared light into heat. The infrared light absorber 110 has a high absorption rate for the infrared light. A temperature of the infrared light absorber 110 increases when the infrared light absorber 110 absorbs the infrared light. Since the carbon nanotubes have a high thermal conductivity, the infrared light absorber 110 can transfer the heat to the thermoelectric element 112. When the thermoelectric element 112 absorbs the heat, a temperature of the thermoelectric element 112 increases, so that the electrical performance of the thermoelectric element 112 can be changed.

The thermoelectric element 112 may be a pyroelectric element, a thermistor, or a thermocouple element. A material of the pyroelectric element has a high thermoelectric coefficient, such as lead zirconate titanate-based ceramics, lithium tantalate, lithium niobate, triglyceride sulfate, and the like. The thermistor may be a semiconductor thermistor, a metal thermistor, an alloy thermistor, or the like. In one embodiment, a material of the thermoelectric element 112 is lead zirconate titanate-based ceramic.

The electrical signal detecting element 114 is used to detect the change in the electrical signal of the thermoelectric element 112. The electrical signal detecting element 114 may be selected according to the thermoelectric element 112. In one embodiment, the thermoelectric element 112 is the pyroelectric element, the increased temperature of the thermoelectric element 112 causes a voltage or a current to appear at both ends of the pyroelectric element, and the electrical signal detecting element 114 is a current-to-voltage converter and configured to detect the change of the voltage or current of the thermoelectric element 112. In another embodiment, the thermoelectric element 112 is the thermistor, a resistance of the thermistor is changed by increasing a temperature of the thermistor; and the electrical signal detecting element 114 including a power supply and a current detector is configured to detect the change of the current, so that a change of the resistance of the electrical signal detecting element 114 can be detected. In another embodiment, the thermoelectric element 112 is the thermocouple element, the infrared light absorber 110 should be disposed at only one end or one part of the thermocouple element. Thus, a temperature difference can be generated between two ends of the thermocouple element, and the temperature difference leads to a potential difference between the two ends of the thermocouple element. The electrical signal detecting element 114 is a voltage detector and configured to detect the potential change of the thermocouple element.

When the infrared detector 100 is in operation, the infrared light irradiates the infrared light absorber 110, the carbon nanotubes convert the infrared light into the heat and transfer the heat to the thermoelectric element 112; the temperature of the thermoelectric element 112 raises after absorbing the heat, and electrical properties such as resistance, current, or voltage of the thermoelectric element 112 are changed; and the electrical signal detecting element 114 detects a change of the electrical properties of the thermoelectric element 112, so that the infrared light can be detected.

A coating layer may be applied on the infrared light absorber 110. The infrared light can pass through the coating layer and be absorbed by the infrared light absorber 110, because the coating layer is transparent. Thus, the coating layer does not affect the absorption performance of the infrared light absorber 110. The coating layer may improve mechanical properties of the infrared light absorber 110. The coating layer is located on a surface of the carbon nanotubes. In one embodiment, the coating layer is located on an outer surface of each of the carbon nanotubes. A material of the coating layer may be photoresist, transparent polymer, or the like. In one embodiment, the material of the coating layer is ultraviolet photoresist that can be cured under the irradiation of ultraviolet light. The ultraviolet photoresist may be polyvinyl alcohol cinnamate, cyclized rubber resist agent, or the like.

Figure 23A:
FIG. 23A shows an optical photo of an infrared light absorber scraped by a cloth.
Figure 23B:
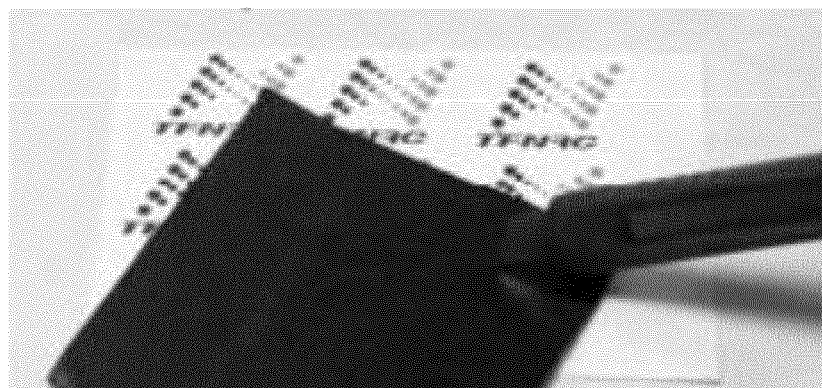
FIG. 23B shows an optical photo of an infrared light absorber scraped by a knife.
Figure 23C:
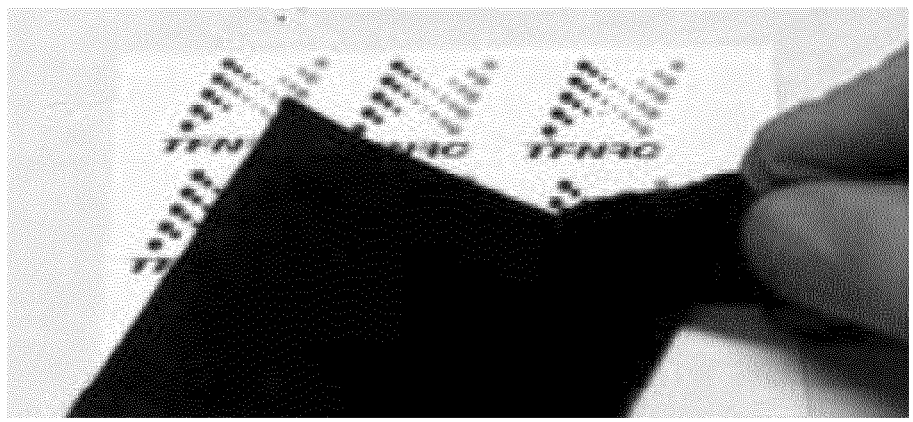
FIG. 23C shows an optical photo of an infrared light absorber scraped by a sandpaper.

In one embodiment, the ultraviolet photoresist is deposited on the surface of the carbon nanotubes of the infrared light absorber 110, and then the ultraviolet light irradiates the infrared light absorber 110, so that the ultraviolet photoresist is cured and tightly disposed on the surface of the carbon nanotubes. The role of the ultraviolet light irradiation not only promotes a close combination of the infrared light absorber 110 and the ultraviolet photoresist, but also enhances a surface morphology of the carbon nanotube network structure in the infrared light absorber 110. Thus, the abrasion resistance of the infrared light absorber 110 can be improved. The stacked drawn carbon nanotube films of the infrared light absorber 110 form the carbon nanotube network structure. FIG. 23 shows optical photos of the infrared light absorber 110 scraped by a cloth, a knife, and a sandpaper, respectively. Seen from FIG. 23, the infrared light absorber 110 coated by the cured ultraviolet photoresist has good abrasion resistance and is not easily damaged when it is scratched by the cloth, the knife, and the sandpaper.

The infrared detector 100 has the following advantages: first, the infrared light absorber 110 has a good absorption performance in a range from NIR wavelength to MIR wavelength (2 μm to 20 μm) and a range from UV wavelength to MIR wavelength (250 nm to 20 μm), thereby improving the responsivity and sensitivity of the thermoelectric element 112, so that the infrared detector 100 has a higher sensitivity; second, the infrared light absorber 110 has an omnidirectional absorption performance that is not affected by different polarization of light, thereby expanding the application fields of the infrared detector 100.

Figure 24:
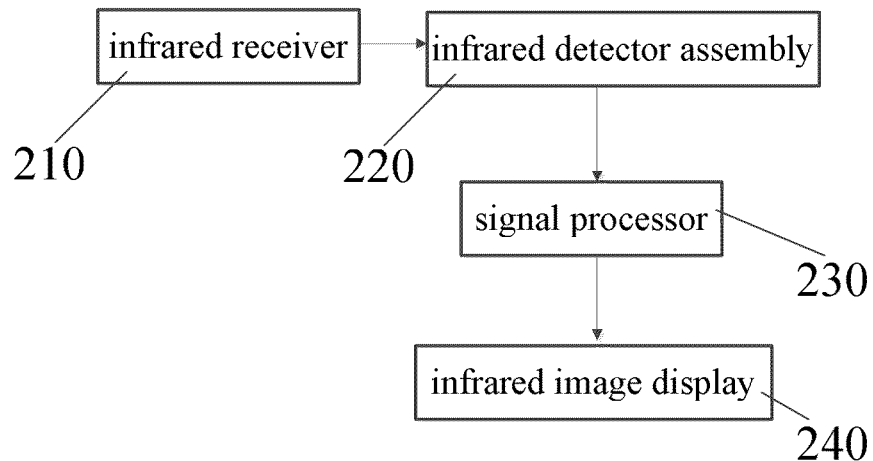
FIG. 24 shows a schematic view of a third embodiment of an infrared imager.

FIG. 24 shows an infrared imager 200 of a third embodiment. The infrared imager 200 includes an infrared receiver 210, an infrared detector assembly 220, a signal processor 230, and an infrared image display 240. The infrared receiver 210 is configured to receive infrared light and transfer the infrared light to the infrared detector assembly 220. The infrared detector assembly 220 is configured to convert the infrared light into an electrical signal and transfer the electrical signal to the signal processor 230. The signal processor 230 is configured to process the electrical signal to obtain thermal field distribution data. The infrared image display 240 is configured to display an infrared thermal image according to the thermal field distribution data.

The infrared receiver 210 is configured to receive the infrared light emitted by an object. In one embodiment, the infrared receiver 210 is the infrared lens. After the infrared light emitted by the object is received and converged by the infrared lens, the infrared light is directly transferred to the infrared detector assembly 220. It can be understood that the infrared receiver 210 can be omitted.

The infrared detector assembly 220 includes a plurality of the infrared detectors 100. The plurality of the infrared detectors 100 are arranged to form a two-dimensional array, and each of the plurality of the infrared detectors 100 can convert the infrared light into an electrical signal. The each of the infrared detector 100 is equivalent to one pixel, and the each of the infrared detector 100 converts the infrared radiation into the electrical signal. Thus, the infrared detector assembly 220 can detect the infrared light emitted by the object. A distance between any two adjacent infrared detectors 100 can be selected according to the thermal imaging resolution.

The signal processor 230 is configured to process the electrical signal of the each of the infrared detector 100 to obtain the thermal field distribution data of the object. The signal processor 230 can calculate temperature data of each corresponding surface position of the object according to the change of the electrical signal of the each of the infrared detector 100. The temperature data can form the thermal field distribution data of the object. Thus, the signal processor 230 can calculate the thermal field distribution data by the electrical signal of the each of the infrared detector 100.

The infrared image display 240 is configured to display the infrared thermal image according to the thermal field distribution data. Different temperatures can be displayed in different colors in the infrared thermal image. The infrared thermal image corresponds to the temperature distribution of the object. Thus, the infrared thermal image can reflect a temperature of each position of the object. For example, when the infrared imager 200 is used in a medical field, a human body can be thermally imaged by the infrared imager 200, thus doctors can determine the disease and the extent of the disease in different parts of the body according to the thermal image, thereby providing a basis for clinical diagnosis.

When the infrared imager 200 is in operation, the infrared light emitted by the object is received by the infrared receiver 210; the infrared receiver 210 receives the infrared light and transfers the infrared light to the infrared detector assembly 220; the infrared detector assembly 220 converts the infrared light into the electrical signals and transmit the electrical signals to the signal processor 230; the signal processor 230 processes and calculates the electrical signals to obtain the thermal field distribution data; the infrared image display 240 displays the infrared thermal image of the object according to the thermal field distribution data.

The infrared imager 200 has the following advantages: first, the infrared light absorber 110 has a good absorption performance in a range from NIR wavelength to MIR wavelength (2 μm to 20 μm) and a range from UV wavelength to MIR wavelength (250 nm to 20 μm), thereby improving the responsivity and sensitivity of the thermoelectric element 112, so that the infrared imager 200 has a higher sensitivity; second, the infrared light absorber 110 has an omnidirectional absorption performance that is not affected by different polarization of light, thereby expanding the use range of the infrared imager 200.

Figure 25:
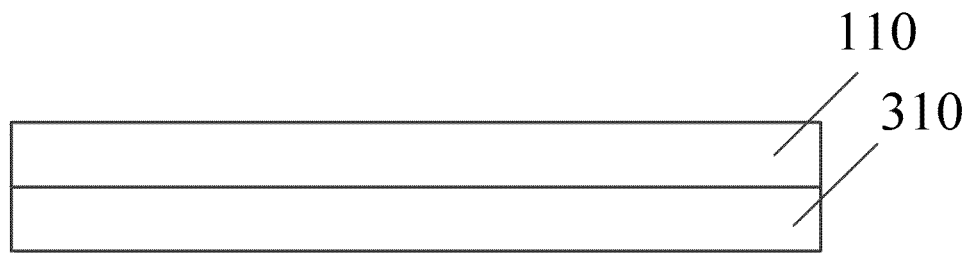
FIG. 25 shows a schematic view of a fourth embodiment of an infrared stealth cloth.

FIG. 25 shows an infrared stealth cloth 300 of a fourth embodiment. The infrared stealth cloth 300 includes a cloth substrate 310 and the infrared light absorber 110 located on the cloth substrate 310. The infrared light absorber 110 is the fourth sample 40. The infrared light absorber 110 may be located between two cloth substrates 310 to form a sandwich structure. The plurality of carbon nanotubes is parallel to a surface of the infrared light absorber 110 close to the cloth substrate 310.

The infrared light absorber 110 can be in direct contact with the cloth substrate 310. The infrared light absorber 110 can be adhered to the cloth substrate 310 by adhesive. In one embodiment, the infrared light absorber 110 is located on the cloth substrate 310, and then the infrared light absorber 110 and the cloth substrate 310 are wetted with an organic solvent. A surface tension is generated by volatilization of the organic solvent. The infrared light absorber 110 can be tightly combined with the cloth substrate 310 by the surface tension. A material of the organic solvent is not limited, as long as the organic solvent is volatile and does not dissolve the cloth substrate 310. In one embodiment, the organic solvent is ethanol. In one embodiment, the cloth substrate 310 defines a through hole (not shown), and the infrared light absorber 110 is suspended on the cloth substrate 310. A material of the cloth substrate 310 is not limited, and the material such as cotton, polyester, silk, wool, hemp, or leather may be used. In one embodiment, the infrared light absorber 110 is sewn between two cloth substrates 310.

FIG. 26 shows an optical photo of a hand covered by the infrared stealth cloth 300. FIG. 27 shows a thermal photo of the hand covered by the infrared stealth cloth 300. Seen from FIG. 26 and FIG. 27, when the hand is covered by the infrared stealth cloth 300, infrared light emitted by the hand is absorbed by the infrared stealth cloth 300. Thus, the infrared light emitted by the hand cannot pass through the infrared stealth cloth 300, and be detected by an infrared light system. Thus, the infrared stealth cloth 300 has a good stealth effect.

FIG. 28 shows infrared stealth clothes 400 of a fifth embodiment. At least a portion of the infrared stealth clothes 400 is made of the infrared stealth cloth 300. The whole infrared stealth clothes 400 can be made of the infrared stealth cloth 300, or a portion of the infrared stealth clothes 400 is made of the infrared stealth cloth 300. The infrared stealth clothes 400 are not limited to clothes, and the infrared stealth clothes 400 can be a glove, a mask, or the like. The clothes, glove, mask can be collectively referred to as the infrared stealth clothes 400. In another embodiment, the infrared stealth clothes 400 include a clothes body 410, and at least a portion of the clothes body is made of the infrared stealth cloth 300.

The infrared stealth cloth 300 and the infrared stealth clothes 400 have the following advantages: first, the infrared light absorber 110 has a good absorption performance in the range from NIR wavelength to MIR wavelength (2 μm to 20 μm) and a range from UV wavelength to MIR wavelength (250 nm to 20 μm), thereby improving the responsivity and sensitivity of the thermoelectric element 112, so that the infrared stealth cloth 300 and the infrared stealth clothes 400 have a good stealth effect; second, the infrared light absorber 110 has an omnidirectional absorption performance that is not affected by different polarization of light, thereby expanding the use range and improving the stealth effect of the infrared stealth cloth 300 and the infrared stealth clothes 400.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. An infrared detector, comprising:
   an infrared light absorber configured to absorb infrared light and convert the infrared light into heat; wherein the infrared light absorber comprises a carbon nanotube structure, and the carbon nanotube structure comprises:
   a first drawn carbon nanotube film comprising a plurality of first carbon nanotubes joined end-to-end by van der Waals attractive force and substantially extending along a first direction;
   a second drawn carbon nanotube film comprising a plurality of second carbon nanotubes joined end-to-end by van der Waals attractive force and substantially extending along a second direction; and
   a third drawn carbon nanotube film comprising a plurality of third carbon nanotubes joined end-to-end by van der Waals attractive force and substantially extending along a third direction;
   wherein the first drawn carbon nanotube film, the second drawn carbon nanotube film, and the third drawn carbon nanotube film are stacked on and directly contacts with each other; and the first direction and the second direction form an angle of about 42 degrees to about 48 degrees, and the first direction and the third direction form an angle of about 84 degrees to about 96 degrees;
   a thermoelectric element, wherein the infrared light absorber is located on the thermoelectric element; and
   an electrical signal detecting element configured to detect a change of an electrical signal of the thermoelectric element.

2. The infrared detector of claim 1, wherein the plurality of first carbon nanotubes is joined end-to-end along a length extending direction of the plurality of first carbon nanotubes.

3. The infrared detector of claim 1, wherein the plurality of second carbon nanotubes is joined end-to-end along a length extending direction of the plurality of second carbon nanotubes.

4. The infrared detector of claim 1, wherein the plurality of third carbon nanotubes is joined end-to-end along a length extending direction of the plurality of third carbon nanotubes.

5. The infrared detector of claim 1, wherein the carbon nanotube structure consists of the first drawn carbon nanotube film consisting of the plurality of first carbon nanotubes, the second drawn carbon nanotube film consisting of the plurality of second carbon nanotubes, and the third drawn carbon nanotube film consisting of the plurality of third carbon nanotubes.

6. The infrared detector of claim 1, wherein the first direction and the second direction form an angle of about 45 degrees, the first direction and the third direction form an angle of about 90 degrees, and the second direction and the third direction form an angle of about 45 degrees.

7. The infrared detector of claim 1, wherein the infrared light absorber is in direct contact with the thermoelectric element; and the first direction, the second direction, and the third direction are substantially parallel to a contact surface between the thermoelectric element and the infrared light absorber.

8. The infrared detector of claim 1, wherein the infrared light absorber further comprises a transparent coating layer located on the carbon nanotube structure.

9. The infrared detector of claim 8, wherein a material of the coating layer is photoresist or polymer.

10. The infrared detector of claim 8, wherein a material of the coating layer is polyvinyl alcohol cinnamate or cyclized rubber resist agent.

11. The infrared detector of claim 1, wherein an absorptivity of the carbon nanotube structure in a wavelength range from about 250 nm to about 2 μm is greater than or equal to 98.85%.

12. The infrared detector of claim 1, wherein an absorptivity of the carbon nanotube structure in a wavelength range from about 2 μm to about 20 μm is greater than or equal to 98.975%.

13. The infrared detector of claim 1, wherein the thermoelectric element is a pyroelectric element, a thermistor, or a thermocouple element.

14. An infrared imager, comprising:
   a plurality of infrared detectors arranged to form a two-dimensional array, wherein each of the plurality of infrared detectors comprises:
   an infrared light absorber configured to absorb infrared light and convert the infrared light into heat; wherein the infrared light absorber comprises a carbon nanotube structure, and the carbon nanotube structure comprises:
   a first drawn carbon nanotube film comprising a plurality of first carbon nanotubes joined end-to-end by van der Waals attractive force and substantially extending along a first direction;
   a second drawn carbon nanotube film comprising a plurality of second carbon nanotubes joined end-to-end by van der Waals attractive force and substantially extending along a second direction; and
   a third drawn carbon nanotube film comprising a plurality of third carbon nanotubes joined end-to-end by van der Waals attractive force and substantially extending along a third direction;
   wherein the first drawn carbon nanotube film, the second drawn carbon nanotube film, and the third drawn carbon nanotube film are stacked on and directly contacts with each other; and the first direction and the second direction form an angle of about 42 degrees to about 48 degrees, and the first direction and the third direction form an angle of about 84 degrees to about 96 degrees;
   a thermoelectric element, wherein the infrared light absorber is located on the thermoelectric element; and
   an electrical signal detecting element configured to detect a change of an electrical signal of the thermoelectric element;
   a signal processor configured to process the electrical signal to form thermal field distribution data; and
   an infrared image display configured to display an infrared thermal image according to the thermal field distribution data.

15. The infrared imager of claim 14, further comprising an infrared receiver configured to receive the infrared light and transfer the infrared light to the plurality of infrared detectors.

16. The infrared imager of claim 15, wherein the infrared receiver is an infrared lens.

17. The infrared imager of claim 14, wherein the first direction and the second direction form an angle of about 45 degrees, and the first direction and the third direction form an angle of about 90 degrees, the second direction and the third direction form an angle of about 45 degrees.

18. The infrared imager of claim 14, wherein the carbon nanotube structure consists of the first drawn carbon nanotube film consisting of the plurality of first carbon nanotubes, the second drawn carbon nanotube film consisting of the plurality of second carbon nanotubes, and the third drawn carbon nanotube film consisting of the plurality of third carbon nanotubes.

19. The infrared imager of claim 14, wherein an absorptivity of the carbon nanotube structure in a wavelength range from about 250 nm to about 2 μm is greater than or equal to 98.85%.

20. The infrared imager of claim 14, wherein an absorptivity of the carbon nanotube structure in a wavelength range from about 2 μm to about 20 μm is greater than or equal to 98.975%.

* * * * *